United States Patent
Ramm et al.

(10) Patent No.: US 9,230,778 B2
(45) Date of Patent: Jan. 5, 2016

(54) METHOD FOR REMOVING HARD CARBON LAYERS

(75) Inventors: Jürgen Ramm, Maienfeld (CH); Beno Widrig, Bad Ragaz (CH)

(73) Assignee: OERLIKON SURFACE SOLUTIONS AG, TRUBBACH, Trubbach (CH)

( * ) Notice: Subject to any disclaimer, the term of this patent is extended or adjusted under 35 U.S.C. 154(b) by 0 days.

(21) Appl. No.: 14/124,394

(22) PCT Filed: May 31, 2012

(86) PCT No.: PCT/EP2012/002305
§ 371 (c)(1),
(2), (4) Date: Apr. 9, 2014

(87) PCT Pub. No.: WO2012/167886
PCT Pub. Date: Dec. 13, 2012

(65) Prior Publication Data
US 2014/0224768 A1 Aug. 14, 2014

(30) Foreign Application Priority Data

Jun. 7, 2011 (DE) .......................... 10 2011 105 654

(51) Int. Cl.
*H01L 21/302* (2006.01)
*H01L 21/461* (2006.01)
*B44C 1/22* (2006.01)
(Continued)

(52) U.S. Cl.
CPC ....... *H01J 37/32064* (2013.01); *C23C 16/0245* (2013.01); *H01L 21/31116* (2013.01); *H01L 21/31122* (2013.01); *H01J 2237/3341* (2013.01);
(Continued)

(58) Field of Classification Search
None
See application file for complete search history.

(56) References Cited

U.S. PATENT DOCUMENTS 5,308,950 A * 5/1994 Ramm et al. ............. 219/121.43
5,993,680 A 11/1999 Sugiyama
(Continued)

FOREIGN PATENT DOCUMENTS

CN 101308764 A 11/2008
DE 19831914 A1 1/2000
(Continued)

OTHER PUBLICATIONS

Castaneda, et al. "Surface modifications in diamond-like carbon films submitted to low-energy nitrogen ion bombardment", Nuclear Instruments & Methods in Physics Research, Section—B:Beam Interactions with Materials and Atoms, Elsevier, Amsterdam, NL, vol. 175-177, Apr. 1, 2001.
(Continued)

*Primary Examiner* — Stephanie Duclair
(74) *Attorney, Agent, or Firm* — Pearne & Gordon LLP

(57) ABSTRACT

The invention relates to a method for removing carbon layers, in particular ta-C layers, from substrate surfaces of tools and components. The substrate to be de-coated is accordingly arranged on a substrate support in a vacuum chamber, the vacuum chamber is charged with at least one reactive gas assisting the evacuation of carbon in gaseous form and a low-voltage plasma discharge is created in the vacuum chamber to activate the reactive gas and hence assist the required chemical reaction or reactions to de-coat the coated substrate. The low-voltage plasma discharge is a dc low-volt arc discharge, the substrate surfaces to be de-coated are bombarded substantially exclusively with electrons and oxygen, nitrogen and hydrogen are used as reactive gas.

10 Claims, 3 Drawing Sheets

(51) Int. Cl.
| | |
|---|---|
| *C03C 15/00* | (2006.01) |
| *C03C 25/68* | (2006.01) |
| *C23F 1/00* | (2006.01) |
| *C23F 3/00* | (2006.01) |
| *H01J 37/32* | (2006.01) |
| *H01L 21/311* | (2006.01) |
| *C23C 16/02* | (2006.01) |
| *H01L 21/02* | (2006.01) |
| *H01L 29/66* | (2006.01) |

(52) U.S. Cl.
CPC ..... *H01L 21/02376* (2013.01); *H01L 29/66015* (2013.01)

(56) References Cited

U.S. PATENT DOCUMENTS

| | | | |
|---|---|---|---|
| 6,331,332 | B1 | 12/2001 | Wang |
| 6,902,774 | B2 | 6/2005 | Nicolussi |
| 2007/0187229 | A1 | 8/2007 | Aksenov |
| 2010/0154707 | A1* | 6/2010 | Ishizuka et al. ............... 118/696 |

FOREIGN PATENT DOCUMENTS

| | | |
|---|---|---|
| EP | 0 510 340 A1 | 10/1992 |
| EP | 0652301 A1 | 5/1995 |
| EP | 0666335 A1 | 8/1995 |
| EP | 1725700 A1 | 11/2006 |
| EP | 2 180 499 A2 | 4/2010 |
| WO | 2005/073433 A1 | 8/2005 |
| WO | 2009/132758 A1 | 11/2009 |

OTHER PUBLICATIONS

Tanoue et al., "Removal of Diamond-like Carbon Film by Oxygen-dominated Plasma Beam Converted from Filtered Carbon-cathodic Arc", Japanese Journal of Applied Physics Japan Soceity of Applied Physics Japan, vol. 50 No. 1, Jan. 2011.

International Search Report for PCT/EP2012/002305 dated Oct. 4, 2012.

International Preliminary Report on Patentability for PCT/EP2012/002305 dated Dec. 10, 2013.

Written Opinion for PCT/EP2012/002305 dated Dec. 10, 2013.

\* cited by examiner

METHOD FOR REMOVING HARD CARBON LAYERS

STRIPPING PROCESS FOR HARD CARBON COATINGS

The present invention relates to a process for removing carbon layers or carbon coatings, particularly ta-C layers from the substrate surfaces of tools and parts. The process enables a simplified and industrially suitable processing of such substrates in large quantities, with the process able to be performed in the same vacuum chamber in which the de-coated substrate can be re-coated. The process according to the present invention serves especially for commercial stripping of ta-C layers from costly tools and parts for the purpose of re-coating. The process is especially advantageously applicable for substrates with surfaces displaying sharp edges and/or complex geometries.

COATING AND DE-COATING SURFACES

It is within the state of the art to provide tools and parts with thin coatings in order to improve their characteristics for example with respect to wear. Coatings of hard material for wear protection of surfaces of tools and parts are commonly clad with coating thicknesses of at least 0.1 µm. In many areas these tools and parts are made of costly materials, and the manufacturing process is very involved. For this reason, in the development of coatings and coating processes, the development of suitable de-coating processes must also be given consideration.

A suitable de-coating process should fundamentally enable a complete removal of the coating from the surface of the substrate without leading to damage to the substrate surface or alteration of the substrate geometry. In the process, re-coating and reuse of the coated tool or part should be possible, which aids in reducing the cost, and contributes to a better utilization of natural resources.

CARBON COATINGS

Carbon coatings in the context of the present invention are defined as follows:

Carbon coatings are thin layers consisting predominantly of the chemical element carbon. Among these are plasma polymer coatings, amorphous diamond-like coatings (DLC), CVD diamond coatings and graphite coatings. Coatings of carbon allow many surface functions to be realized, principally in the realm of tribology or in applications in the whole realm of wear protection, for example in cutting, stamping and forming tools, or the protection of component parts.

Graphite coatings are carbon layers with a maximum resistance to friction. If the $sp^3$ orbitals of atoms overlap, they can form stable covalent bonds which display a tetrahedral structure. These form the foundation structure of the diamond crystal. They can conventionally be created by special gaseous phase chemical deposition processes. The result is micro- or nanocrystalline layers, which can be textured by targeted alteration of the process parameters, and can thus display extremely low friction and wear.

Amorphous or X-ray amorphous carbon coatings, known as diamond-like carbon coatings or DLC coatings, according to VDI 2840 are delineated as follows:

Hydrogen-free amorphous carbon coatings, a-C, consist predominantly of $sp^2$ hybridized bonds, and are therefore designated as graphite-like carbon coatings.

Tetrahedral hydrogen-free amorphous carbon coatings, ta-C, are completely amorphous, that is, they have no discernible crystalline structure. These coatings consist predominantly of $sp^3$ hybridized bonds, so that they equate to diamond coatings.

Metal-containing hydrogen-free amorphous carbon coatings, a-C:Me consist predominantly of $sp^2$ hybridized bonds.

Hydrogen-containing amorphous carbon coatings, a-C:H, consist of $sp^2$ and $sp^3$ hybridized bonds.

Tetrahedral hydrogen-containing amorphous carbon coatings, ta-C:H, with predominantly $sp^3$ hybridized carbon atoms Metal-containing hydrogen-containing amorphous carbon coatings, a-C:H:Me, with predominantly $sp^2$ hybridized carbon atoms Hydrogen-containing amorphous carbon coatings modified with non-metals, a-C:H:X (X=Si, O, N, F, B, . . . ), with predominantly $sp^3$ hybridized carbon atoms.

THE DE-COATING PROBLEM FOR TA-C COATINGS

The ta-C coatings have hardnesses up to 85 GPa, and are therefore clearly above the diamond-like carbon coatings conventionally deposited with plasma based CVD with hydrogen contents up to 30 at %, primarily with respect to coating hardness and temperature stability. The fraction of tetrahedral diamond-like bonds in ta-C coatings (of up to 85%) is the determining factor for the particularly great hardness of these coatings.

Ta-C coatings can be produced by various processes. Preferable, however, are laser pulse deposition processes (see for example the Report on Research in Technical Institutes, *Bericht über Forschung an Fachhochschulen*, issued in 2006 by the German Bundesministerium für Bildung und Forschung, pp. 21-22), and cathode ray vaporization processes (see for example U.S. Pat. No. 6,331,332, EP0652301, US20070187229 and EP0666335).

Possible application areas for ta-C coatings are parts and machine components in automaking, toolmaking and machines manufacture which require a super-hard surface coating (source: Bericht über Forschung an Fachhochschulen, issued in 2006 by the German Bundesministerium für Bildung und Forschung, pp. 21-22). In the area of tools coatings, ta-C coatings find application especially for cutting tools for Al and Al alloys, for Cu and for noble metals. Promising applications potential also exists for forming and stamping tools.

Despite the very interesting properties of ta-C coatings, they have to date only become established in small market segments. A problem in the application of ta-C coatings is their inadequate adhesion to certain materials (for example on various types of steel and above all for greater ta-C coating thicknesses, as ≥1 µm traceable to their very high coating surface tension. Additionally, the synthesis of these ta-C coatings at low substrate temperatures ($T_s$) typically takes place below 150° C., in order to achieve its characteristically great hardness. This means that the often used heat treatment and etching processes often used as pretreatment for better coating adhesion must be dispensed with or greatly shortened, as these would lead to higher substrate temperatures.

For this reason, metal ion etching (MIE) is used for improvement of the coating adhesion of ta-C coatings. Metal ion etching is carried out in such a way that the substrate surface is bombarded with metal ions (e.g. Cr ions), in just such a way that no significant metallic layer accumulates, that is, there arises no metallic interface between the substrate and the coating. Well-adhering hard ta-C coatings therefore as a rule display only a very thin metal interface, or practically none at all. Because the generally used wet chemical de-coating process is based upon attacking and removing a metallic interface, and with it the coating, ta-C coatings represent a heretofore unresolved problem with respect to de-coating.

STATE OF THE ART

A number of stripping processes are known in the current state of the art for the removal of hard coating systems, for example applying galvanic PVD or CVD processes to various surfaces. From WO2005073433, WO2009132758 and EP1725700 are made known a number of wet chemical processes for de-coating, which however (as mentioned above) require the presence of a metallic intermediate layer between the substrate and the coating.

Mechanical processes are often used also as stripping processes. In JP2003200350 for example is presented an example of a mechanical process for the stripping of hard carbon coating systems. This method involves a jet process using a solid material. The jet particles are a fine-grained abrasive powder (e.g. fine aluminum oxide or fine diamond powder), with air as a carrier medium. The hard carbon coating is removed by the impact of the abrasive jet material on the coated substrate.

Laser beams can also be used for material separation, as disclosed in DE19831914.

Combined processes can also be used for removal of corrosion resistant protective coatings and polymer residues of substrates (e.g. semiconductor plates), as disclosed for example in CN101308764. The stripping process therein described combines an etching process with a wet chemical process, whereby the coated substrate is first etched in a vacuum chamber, and then brought into a stripping chamber to remove the corrosion resistant protective coating, and finally returned to the vacuum chamber to be etched a second time.

EP2180499 discloses an apparatus to perform the process. The stripping process therein disclosed is based upon a low voltage plasma discharge with discharge voltages of 250V to 1000V, with the low voltage plasma discharge being produced using a low frequency generator with a pulse frequency in the range of 20 to 60 kHz.

In EP0510340 was disclosed a hydrogen plasma process for removal of material in a vacuum chamber from substrate surfaces, for example of tools or semiconductors which were subsequently to be coated in a vacuum process. However, the removal of material from surfaces in EP0510340 is intended only for the cleaning of the surfaces of substrates, with only very thin layers with thicknesses of about 10 nm coming into question. In the cleaning process in EP0510340 a low voltage arc discharge is used to activate the reactive gas or hydrogen gas. The authors reported plasma voltage values of up to 55V.

In U.S. Pat. No. 6,902,774 was disclosed a plasma process for the treatment of substrate surfaces which is part of a process of packaging of integrated circuits, whereby a hydrogen or nitrogen or hydrogen-nitrogen plasma is used to enrich the substrate surface with hydrogen and/or nitrogen and thereby to preserve for a long term the suitability of the treated substrate surface for a subsequent process of bonding or adhesion, although directly after plasma treatment and prior to bonding or adhesion the treated substrate surface is kept for a long period in an air atmosphere. For activation of the reactive gas, the use of a low voltage plasma discharge with discharge voltages of 10V to 100V is recommended, in order to minimize heat loads to the substrate.

DIFFICULTIES

For successful application of a wet chemical process for the stripping of ta-C coatings, as mentioned above, the existence of at least one metallic layer is required as an interface between the ta-C coating and the substrate. As already stated, however, for a satisfactory bonding of ta-C coatings with for example a soft steel substrate, optimized MIE pretreatments are performed, which result in no metallic interface or one too thin to be able to employ such a process. Additionally such chemical processes require an infrastructure differing from the coating, and entail high costs for environmentally friendly disposal of chemical residues.

The application of mechanical processes, like the above described jet process for stripping of hard carbon coating systems, is often used for the stripping of diamond and diamond—like coatings. However, mechanical processes are not so suitable or effective when substrates with sharp edges and/or complex geometries are to be de-coated, because through this type of treatment there arise undesired deformations of the cutting angle (in the case of cutting or stamping tools) or of the overall geometry of the substrate. Additionally, by such treatment there frequently arise undesirable surface tensions in the coated substrate. Furthermore, the investment for the necessary substrate holder system may be great, if the stripping of substrates with complex geometries is involved. In extreme cases, each substrate would have to be positioned, held, and perhaps even moved in a particular way, in order for an optimal distribution of the forces impinging on the surface of the substrate.

Consequently, in the view of the inventor, it is advantageous for plasma based processes to come into question for the stripping of ta-C coatings.

In the plasma based process for substrate-protecting removal of hard coatings from a substrate according to EP2180499 (mentioned above), the substrate to be stripped is placed on a substrate holder in a vacuum chamber between two plate antennas, the vacuum chamber is charged with a reactive gas, in gaseous form, capable of carrying off carbon, with the two antennas and in some cases the substrate holder carrying a pulsed voltage, supplied by a low frequency generator, of 250V to 1000V at 20 to 60 kHz, and finally the substrate is bombarded by the plasma for a sufficient period of time.

The authors of EP2180499 mention that with the disclosed process, carbon coatings of all kinds can be removed, for example besides amorphous carbon and graphite, also diamond and in particular DLC coatings with a varying to high proportion of $sp^3$ hybridized carbon.

The authors of EP2180499 further disclose that the de-coating of the substrate is performed in the presences of a gas reactive with carbon. The authors mention that coming into question as such reactive gases are oxygen and oxygen-containing gases of any origin, hydrogen and hydrogen mixtures, and halogens in the form of low corrosive halogen compounds (e.g. halogen compounds with nitrogen and carbon, such as $NF_3$, $CF_4$, $C_2F_6$, $CH_2F_2$), pseudohalogen compounds (e.g. HCN, $(CN)_2$) and nitrogen oxides (e.g. $N_2O$, NO).

Additionally in EP2180499 examples are given in which DLC and diamond coatings of temperature sensitive substrates are stripped at temperatures of 100-250° C. Oxygen was used as the reactive gas. Hydrogen-containing DLC coatings were removed by aid of both bipolar and unipolar excited plasmas (pulsed direct current plasma discharges) with discharge voltages of 500-900V and excitation frequencies of 30-40 kHz. The de-coating times were dependent on the coating thickness and the pulse modulation. Diamond coatings were removed for example by aid of a unipolar excited plasma with a discharge voltage of 800V and an excitation frequency of 40 kHz. The de-coating time was 14 to 20 hours. It was also mentioned in EP2180499 that the de-coated substrate could immediately thereafter be further cleaned with a constant pressure of a hydrogen plasma (e.g. a hydrogen-argon plasma) in order to remove discolorations of the substrate following the stripping treatment.

For commercial stripping of ta-C coatings from parts and tools, the process described in EP2180499 has primarily the following disadvantages:
- Low frequency generators which must supply high power levels in a plasma and have the capability of unipolar and/or bipolar operation are significantly more costly than simple DC generators. The tendency toward interference of low frequency generators is higher, especially when plasma operation is to be performed for widely varying loading of the system, and no additional adaptations are undertaken.
- The required antenna system for the generation of plasma for the stripping frequently cannot be integrated propitiously and without problems into conventional coating equipment, and can thus in some circumstances entail the use of this process in a new facility.
- The described antenna configuration as a general rule produces sputter plasmas. This type of plasma is characterized by a relatively low flux density, corresponding to a relatively low electron density.
- Because the antennas are immersed in the plasma, it is possible for material from the antenna to sputter, and the sputtered material to contaminate the substrate surface. Such a contamination of the surface is very problematic for the adherence of ta-C coatings.
- The de-coating times for the stripping of diamond coatings with commonly occurring coating thicknesses are very long (14 to 20 hours) in comparison to the reported de-coating times for stripping of DLC coatings with commonly occurring coating thicknesses (about 1 hour). This can be explained by the much higher chemical and thermal stability of diamond coatings. Based on the very high proportion of $sp^3$ hybridized bonds or tetrahedral diamond-like bonds in ta-C coatings (~85%) and the lack of hydrogen included in the coating, the use of this process for the stripping of ta-C coatings with the usual coating thicknesses can be expected to required very long de-coating times (theoretically at least 12 to 17 hours). This speaks against industrial suitability of this process for the de-coating of ta-C coatings, since longer de-coating times are directly associated with economic disadvantage.
- Plasma de-coating using oxygen or an oxygen-containing gas as the reactive gas causes and undesirable oxidation of the surface of metallic substrates. The resulting thin oxide layers must then later be etched away, for example with hydrogen-containing plasmas.
- Through the use of oxygen, not only is the substrate surface oxidized, but also the antenna surfaces, and thus there can be fluctuation of the plasma stripping parameters during the stripping process, that is, the flux density and consequently the electron density in the plasma can vary during the stripping process, and thus the process is difficult to control.

TASK SPECIFICATION

The present invention is based on the task to create improvements over the state of the art by means of an industrial process for the stripping of carbon coatings, particularly CVD (chemical vapor deposition) or PVD (physical vapor deposition) -deposited carbon coatings. The process is especially intended to enable and industrially feasible process for the stripping of ta-C coatings from any type of substrate. The process is intended further to enable the rapid processing of substrates in large quantities. It is preferable for the process according to the invention to take place in the same vacuum chamber in which the substrate to be de-coated will subsequently be re-coated. The process presented according to the invention should advantageously serve for commercial stripping of ta-C coatings from costly tools and parts which may for example include surfaces with sharp edges and/or complex geometries. Additionally, in the process the stripping of ta-C coatings should proceed essentially by means of plasma-based chemical reactions, and any sputtering, i.e. removal of material by ion impact, should be avoided.

ACCOMPLISHMENT OF THE TASK

The task is accomplished by means of a process for reactive stripping of carbon coatings for the substrates on which the said carbon coatings have been deposited, particularly for ta-C coatings on surfaces of parts and tools, whereby the substrate to be stripped is placed on a substrate holder in a vacuum chamber, the vacuum chamber is supplied with at least one reactive gas supporting the removal of carbon, and a low voltage plasma discharge is produced in the vacuum chamber to excite the reactive gas, and thus to support the chemical reaction or reactions necessary for the stripping of the coated substrate, wherein:
1. The low voltage plasma discharge is a low voltage direct current arc discharge characterized by a discharge voltage of a maximum of 120V, and preferably a maximum of 80V;
2. The substrate surfaces to be stripped are bombarded essentially exclusively with electrons, which due to their low mass exclude any sputtering, or with ions with energies below the sputter threshold, i.e. below 20 eV;.
3. In order to remove at least a portion of the carbon coating from the substrate, and in at least one step of the reactive stripping, preferably in the last step of the reactive stripping, a gas is used which includes nitrogen as the reactive gas, preferably consisting largely or entirely of nitrogen.

DESCRIPTION OF THE INVENTION

Figure 1:
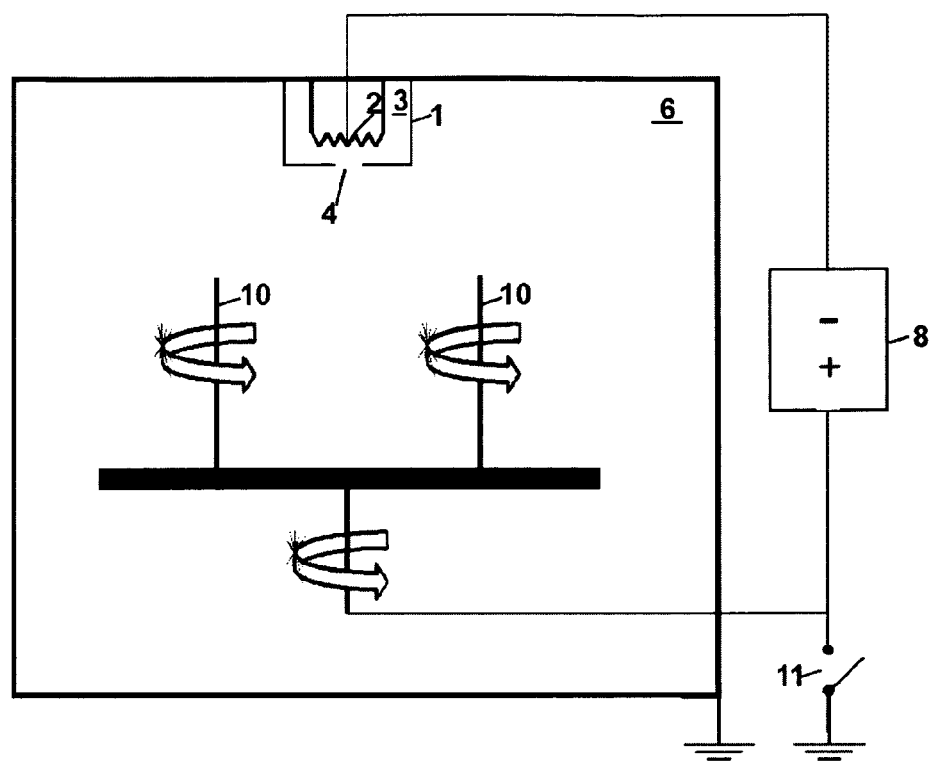
FIG. 1 shows a chamber for removing carbon layers or carbon coatings according to a process variant A.

The invention involves the excitation of a reactive gas, particularly nitrogen, in a low voltage direct current arc discharge, with high electron flows (between 20 A and 1000 A), but with low discharge voltage (between 20V and 80V).

The inventors have determined that despite their low discharge voltage (up to a maximum of 120V, but typically up to about 80V), low voltage direct current arc discharges are suitable not merely to accomplish economical cleaning processes, wherein as a rule layers with a thickness measuring only about 10 nm must be removed (as in EP0510340), but also enable economical processes for stripping of carbon layers or carbon coatings, which fundamentally display a significantly greater thickness than 10 nm, up to ≥0.1 µm.

In addition, the inventors have determined that nitrogen is surprisingly very reactive with ta-C, and is consequently very well suited for reactive stripping of ta-C coatings. The inventors likewise were able to determine that by the reaction of nitrogen with ta-C, no undesired byproducts remain on the substrate, and no undesired reaction of nitrogen with the substrate occurs, but rather that at the most there occurs an enrichment of the substrate surface with nitrogen, which is advantageous for a re-coating of the substrate surface.

The removal of carbon layers or carbon coatings, particularly of CVD or PVD carbon layers which include essentially only carbon bonds is possible according to the invention by the reaction of nitrogen and/or oxygen with carbon, in which the nitrogen and/or oxygen gas is excited by means of a low voltage direct current arc discharge, whereby the low voltage direct current arc discharge occurs with high electron flow or discharge current (typically between 20 A and 1000 A), but with a low discharge voltage (typically between 20V and 80V).

The reactive de-coating according to the present invention can be carried out in one step or a number of steps.

Below are described preferred realizations of the present invention, through which is avoided any sputtering (removal of material by ion impact) which could damage costly substrates with sharp edges and/or complex geometries.

Process Variant A:

According to process variant A, the substrate is connected in the low voltage direct current arc discharge as an anode. Process variant A is represented schematically in FIG. 1. The low voltage direct current arc discharge (not represented) is supplied by a plasma source 1 consisting of a heated filament 2 connected as the cathode in the low voltage direct current arc discharge, and is placed in a filament chamber 3 connected through a small opening 4 (typically between 2 mm and 10 mm in diameter) to the vacuum chamber 6, with the filament chamber electrically insulated from the vacuum chamber. Into the filament chamber 3 is introduced a working gas. Herein, without limitation on the nature of the working gas, the experiments using argon will be described. However, it would be possible, for example, for nitrogen or neon to be used as well. The working gas is pumped in through the pump system of the vacuum chamber (not represented), leading to the fact that due to the small opening 4 a higher pressure is developed in the filament chamber 3 than in the vacuum chamber 6, in which the substrate to be stripped (not shown) is placed in the substrate holder 10. The reactive gas is let into the vacuum chamber 6 directly through a valve or flow regulator (neither shown).

Because the substrate in process A is connected as an anode, the substrate surfaces are bombarded with electrons, which because of their low mass prevent sputtering. Therefore in the discharge region and directly on the substrate surface they excite the reactive gas (here essentially nitrogen gas). Apparently there occurs a dissociation/excitation of molecular nitrogen to atomic nitrogen, which is familiarly much more reactive at low temperatures than molecular nitrogen. Thereby there results a reaction with the ta-C layer, and the formation of transient bonds between carbon and nitrogen, which are either sufficiently stable to be pumped through the vacuum system, or are deposited on the (cooler) locations within the vacuum apparatus.

The discharge currents of process A can be simply determined from the size of the substrate surfaces to be stripped, because the current and thus the current density at the substrate can be adjusted by the direct current generator 8. There is additionally the possibility that above all for temperature-sensitive substrates, a portion of the discharge current is drawn off to the vacuum chamber. It can then occur that the direct current source is applied anodally through a switch 11 to a ground (such as the vacuum chamber), and the switch 11 is indicated in FIG. 1.

To the nitrogen reactive gas can also be added other gases, in the one case to accelerate the reaction, primarily for very thick coating layers, or at the same time to remove along with the ta-C other undesirable coating or interface components by means of a chemical reaction. An addition of hydrogen reduces not only the oxygen component of the coating, but also removes the undesirable residue of oxygen on the de-coated substrate surface. If oxygen is added into the stripping process, the removal of ta-C can be accelerated. Of course it is reasonable to discontinue the oxygen early enough that a complete removal of the ta-C layer has not occurred, and the associated risk of oxidizing the de-coated substrate surface or the parts of the substrate surface exposed by the de-coating.

Figure 2:
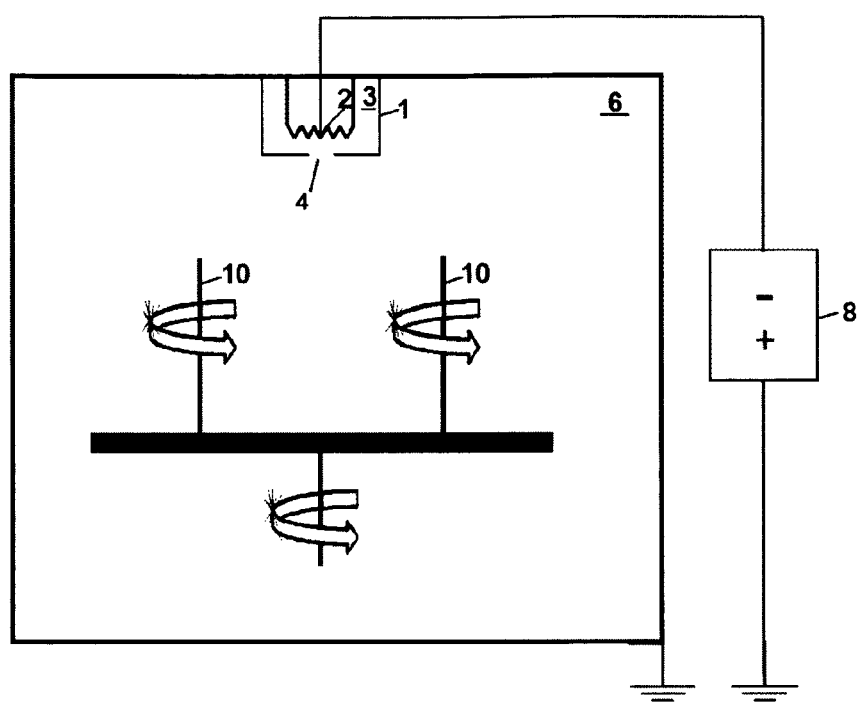
FIG. 2 shows a chamber for removing carbon layers or carbon coatings according to a process variant B.

Process Variant B:

In another process variant B, schematically represented in FIG. 2, the low voltage direct current arc discharge is directed to a ground as the anode, and the substrate merely immersed in the plasma, so that during the stripping process it is at floating potential. This has the consequence that the substrate becomes slightly negatively charged. However, the substrate voltage remains below the sputter threshold voltage, at less than 20V. In this process as well, sputtering is prevented.

Figure 3:
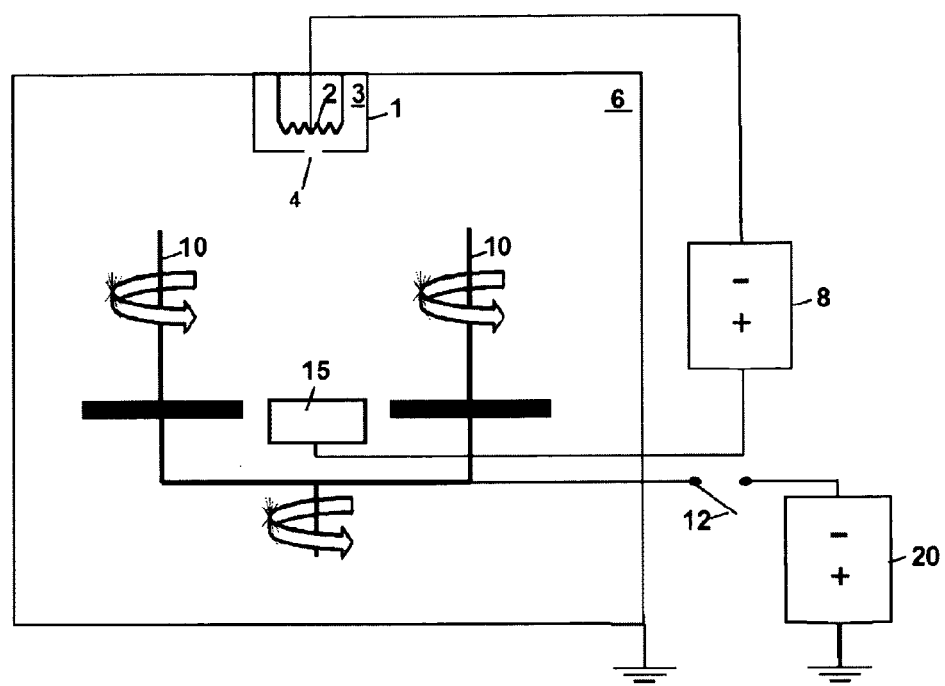
FIG. 3 shows a chamber for removing carbon layers or carbon coatings according to a process variant C.

Process Variant C:

A final process variant C is schematically represented in FIG. 3. In this arrangement, the low voltage direct current arc discharge is directed to an additional electrode 15 in the chamber, constituting an anode. The position of this helper anode 15 is advantageously within the substrate configuration, for example in the center of the vacuum chamber. The substrates are again at floating potential, and again, as in variant B, no sputter occurs, because the negative charge of the substrate is too low for the sputter process. However, by means of an additional source 20, the substrate can be supplied with a negative charge should it become necessary after stripping to further sputter etch the substrate.

Advantages in the use of a direct current low voltage arc discharge according to an arrangement as illustrated in FIGS. 1 to 3 and described in process variants A to C in comparison to a sputter plasma discharge (as described for example in EP2180499) are as follows:

1. The discharge current can be set high enough that for any gas flow, sufficient gas is dissociated or excited to carry out the chemical reaction for stripping of ta-C on the substrate surfaces as efficiently as possible. Moreover, in addition to the discharge current, the flux density and power density at the substrate can be adjusted.
2. The direct current low voltage arc discharge can be positioned anywhere in the vacuum chamber, so that the same vacuum chamber used for stripping can also be used for coating. The same substrate holder can also be used both for stripping and coating.
3. With the choice of a suitable anode (structure, material, etc.) a process can be applied using oxygen plasma for stripping, which can run with stability over an extended period.

Below will be presented several examples of de-coating processes. Reference will be made (except as otherwise expressly stated) solely to process variant A with the switch 11 open, although the gas mixtures apply equally well for the other variants, at the most involving adaptation of the duration of stripping. It is also clear to the expert that the increase in the discharge current and the associated increase in the electron density will affect the stripping duration, as long as sufficient reactive gas is available for activation. Within a pressure range up to about 5 Pa, the greater the arc current and the greater the gas flow, the greater will be the stripping rate. Quite generally it also applies that at higher substrate temperatures the stripping rate will be increased. It will not be discussed in detail in the examples, but the expert is aware that a hard metal substrate can be subjected to greater thermal load than one of HSS steel or aluminum, whereby the stripping rate can be affected.

In table 1 are presented a number of combinations for possible gas flows which will in part be discussed further in examples below. The gas flows indicated as examples in table 1 The gas flows indicated as examples in table 1 and the examples given below for stripping of carbon coatings can be adapted as required (for example taking into account the size of the total surface to be de-coated, the coating thickness, the substrate material and geometry, and type of carbon bonding). Moreover, it is to be noted that the invention is not limited to these examples, but allows other implementations not presented here.

TABLE 1

Process gas variants

| Process | Ar [sccm] | $N_2$ [sccm] | $O_2$ [sccm] | $H_2$ [sccm] | Total pressure [$10^{-3}$ mbar] |
|---|---|---|---|---|---|
| 1 | 60 | | | | 2.1 |
| 2 | 100 | | | | 3.2 |
| 3 | 60 | 200 | | | 6.8 |
| 4 | 60 | 400 | | | 12 |
| 5 | 60 | 800 | | | 24 |
| 6 | 60 | 100 | | 100 | 4.6 |
| 7 | 60 | 100 | | 200 | 6 |
| 8 | 60 | 100 | | 400 | 14 |
| 9 | 60 | 200 | | 400 | 17 |
| 10 | 60 | 100 | 100 | | 6.8 |
| 11 | 60 | | 100 | 200 | 6 |
| 12 | 60 | | 100 | 400 | 14 |
| 13 | 60 | 300 | 100 | | 12 |
| 14 | 60 | 100 | 100 | 400 | 17 |
| 15 | 60 | | 200 | 400 | 17 |

Processes 1 and 2 in table 1 show by way of example the pressure values in the de-coating chamber when the direct current low voltage arc discharge is initiated, before the introduction of a reactive gas into the de-coating chamber, at a discharge current of 150 A and an argon flow of 60 sccm (process 1) or 100 sccm (process 2).

EXAMPLE 1

Example of Implementation According to the Invention

A discharge current of 150 A was established with an argon flow of 60 sccm. Subsequently 200 sccm $N_2$ was introduced into the vacuum chamber as reactive gas leading to a total pressure of 0.68 Pa in the vacuum chamber (corresponding to process 3 in table 1). After four hours, a ta-C coating with a layer thickness of 2 µm was completely removed from a hard metal forming tool. With this example, it could be confirmed that despite their high component of tetrahedral diamond-like bonds, ta-C layers could be rapidly removed from the tool surface according to the present invention with a de-coating rate of about 0.5 µm/hr. The de-coating occurred at a substrate temperature of 500° C.

EXAMPLE 2

Example of Implementation According to the Invention

For exactly the same process parameters, but for a different substrate temperature of 280° C., a 1 µm thick ta-C layer was removed from a steel stamp for aluminum forming in five hours, corresponding to a stripping rate of 0.2 µm/hr. This demonstrates the influence of the substrate temperature on the stripping rate.

EXAMPLE 3

Example of Implementation According to the Invention

For the stripping of a ta-C coating with a layer thickness of 5 µm, the stripping process according to the invention was conducted in two steps, and for each step a nitrogen-containing gas mixture was used. The direct current low voltage arc discharge was operated with a discharge current of 150 A, and an argon flow of 60 sccm. Subsequently, for the first step, a mixed gas of 300 sccm $N_2$ and 100 sccm $O_2$ was introduced into the stripping chamber for 60 minutes (corresponding to process 13 in table 1). Finally, for the second step, (before the ta-C layer was completely removed) a gas mixture of 100 sccm $N_2$ and 400 sccm $H_2$ (corresponding to process 8 in table 1) were introduced into the vacuum chamber for 30 minutes, to prevent the substrate surface exposed by the de-coating from being oxidized. After steps 1 and 2, that is, after 1.5 hours, the substrates were fully de-coated, and no undesirable residues remained on the substrate surface.

EXAMPLE 4

In a further process with the same discharge current and working gas flow as in example 3 (again according to process variant A with the switch 11 open), but with only oxygen as the reactive gas, hard metal milling cutters could be de-coated. Along with the argon (working gas), the oxygen responsible for the stripping process was introduced directly into the vacuum chamber with a constant oxygen flow of 400 sccm. The oxygen introduced was excited by the plasma discharge in a way such that the oxygen reacted with the carbon of the ta-C and the gaseous products of stripping (mostly $CO_2$) were carried out through the vacuum pump system. Under these conditions, ta-C coatings with thicknesses of 2 µm could be completely removed from hard metal milling cutters with diameters of 12 mm without difficulty and within 1 hour.

However, the treatment in oxygen plasma led to slight oxidation of the substrate surface. These thin oxidation layers had to be removed in a second step by aid of a sputter etching process. In the second step, the direct current low voltage arc discharge was conducted between the filament and helper anode again at a constant discharge current of 150 A, and then hydrogen wqs introduced into the vacuum chamber (with the oxygen flow terminated), with a constant gas flow of 250 sccm. In addition, a negative bias voltage of 200V (−DC) was applied to the substrate holder (corresponding to the process configuration according to process variant C in FIG. 3 with the switch 12 closed). The oxidation layers were in this way completely removed by hydrogen etching after 30 minutes. Disadvantageous in this process, not in accordance with the invention, is the ion bombardment of the substrate occurring in the second step, and the concomitant sputtering of the substrate.

EXAMPLE 5

Example of Implementation According to the Invention

With the same configuration as in example 4 (in step 1), but with nitrogen as the reactive gas, ta-C coatings with a thickness of 2 μm were completely removed without difficulty from hard metal milling cutters with diameters of 12 mm within about 4 hours, corresponding to a stripping rate of about 0.5 μm/hr.

Despite the longer stripping times in the de-coating of ta-C layers using nitrogen instead of oxygen as the reactive gas, the use of nitrogen can be seen as advantageous, because no thin oxide layers remain on the substrate surfaces. A disadvantageous hydrogen etching is no longer necessary, which in the de-coating of costly substrates with sharp edges and/or complex geometries is favorably to be avoided.

EXAMPLE 6

Example of Implementation According to the Invention

The stripping can also be carried out in accordance with the invention, especially for great coating thicknesses, in a number of steps, in which in the first step of stripping, primarily oxygen is used as the reactive gas, but the flow of oxygen is terminated early enough, that is, before the ta-C coating is completely removed, and then for the second step a mixture of nitrogen and hydrogen gas is used as the reactive gas for complete removal of the carbon coating. In this way, oxidation of the substrate surfaces exposed by the stripping is prevented.

EXAMPLE 7

Example of Implementation According to the Invention

In accordance with the invention, the stripping of thicker carbon coatings can be conducted in a manner similar to that of example 6, in that, in a first step of the stripping, predominantly oxygen gas is used as the reactive gas for removal of a first part of the entire carbon layer (with the oxygen flow being terminated early enough, that is, before the ta-C coating is completely removed from any part of the substrate surface, and the surface de-coated by the reaction with oxygen begins to oxidize), in a second step of the stripping, a mixture for example of hydrogen gas and nitrogen gas is used for removal of a second art of the entire carbon coating, and finally, in a third step, predominantly nitrogen is used for removal of the entire carbon coating, that is, completing the stripping of the carbon coating.

In accordance with the invention are all of the de-coating processes resulting from combinations of the implementation examples given.

It is also possible using the process according to the invention to de-coat various substrates with differing coating thicknesses in a single batch, whereby in the first step oxygen or an oxygen-containing gas is used as the reactive gas, and must be computed how long this first step should continue, so that oxidation of de-coated substrate surfaces is prevented.

With the aid of the de-coating process according to the present invention it is also possible to remove carbon coatings which contain besides carbon also other nonmetallic elements such as hydrogen (H), boron (B), silicon (Si) and germanium (Ge).

In the following, the present invention will be summarized:

The present invention relates to a process for reactive stripping of carbon layers from a substrate, particularly for the reactive removal of ta-C coatings from the surface of parts and tools, in which the substrate to be de-coated is placed on a substrate holder in a vacuum chamber, the vacuum chamber is charged with at least one reactive gas supporting the removal of carbon in gaseous form, and a plasma discharge is initiated in the vacuum chamber to support the necessary chemical reaction or reactions to de-coat the coated substrate, and the reactive de-coating proceeds in one step or a number of steps, wherein the plasma discharge is produced as a low voltage direct current arc discharge, between 20 A and 1000 A, and preferably between 50 A and 300 A, with discharge voltage of at most 120 V, preferably between 20 V and 80 V.

The de-coating process according to the present invention, described above, is advantageously implemented in such a way that:

- The substrate is connected as an anode for the direct current low voltage arc discharge, and thereby the substrate surface is primarily bombarded exclusively with electrons, which due to their low mass exclude any sputtering, or
- The substrate is insulated within the direct current low voltage arc discharge, whereby the ions striking the substrate essentially possess energies below 20 eV, below the sputter threshold, or
- For the direct current low voltage arc discharge, an electrode separate from the substrate holder and the chamber wall is used as the anode, and the substrate is held at a floating potential.

Advantageously the de-coating process according to the present invention is carried out in such a way that in order to remove at least a part of the carbon coating to be stripped from the substrate, during at least one step of the stripping process, preferably during the last step of reactive stripping, a nitrogen-containing gas is used as the reactive gas, and preferably the nitrogen-containing gas consists predominantly of nitrogen, and more preferably consists essentially of only nitrogen.

Moreover the de-coating process according to the present invention is carried out in such a way that in order to remove at least a portion of the carbon coating from the substrate during at least one step of the reactive stripping, but not the last step, preferably during the first step of reactive de-coating, an oxygen-containing gas is used as the reactive gas, preferably a gas containing predominantly oxygen, and more preferably the reactive gas consists essentially of only oxygen. Preferably the flow of the oxygen-containing gas is terminated before the carbon layer has been fully removed from any area of the substrate by reaction with the oxygen, so that the substrate surface exposed by reaction with the oxygen does not begin to oxidize. Advantageously, hydrogen gas is introduced into the stripping chamber after the flow of oxygen-containing gas is terminated, so that oxygen components in the coating and residual oxygen on the substrate surface are reduced.

The present invention also relates to a process for reactive stripping of carbon layers from a substrate, particularly for the reactive removal of ta-C coatings from the surface of parts and tools, in which the substrate to be de-coated is placed on a substrate holder in a vacuum chamber, the vacuum chamber is charged with at least one reactive gas supporting the removal of carbon in gaseous form, and a plasma discharge is initiated in the vacuum chamber to support the necessary chemical reaction or reactions to de-coat the coated substrate, and the reactive de-coating proceeds in one step or a number of steps, whereby in order to remove at least a part of the carbon coating to be stripped from the substrate, during at least the last step of reactive stripping, a nitrogen-containing gas is used as the reactive gas, and preferably the nitrogen-containing gas consists predominantly of nitrogen, and more preferably consists essentially of only nitrogen.

The de-coating process according to the present invention it can also be used to de-coat substrates coated with carbon coatings which contain besides carbon also other nonmetallic elements such as hydrogen (H), boron (B), silicon (Si) and germanium (Ge).

Figure Legend

FIG. 1: Process variant A
FIG. 2: Process variant B
FIG. 3: Process variant C

What is claimed is:

1. Process for reactive de-coating of carbon layers deposited by means of PVD or CVD methods on a substrate, the process being particularly suitable for the reactive removal of ta-C coatings from the surface of parts and tools, the process comprising the steps:
   placing the substrate to be de-coated on a substrate holder in a vacuum chamber,
   charging the vacuum chamber with at least one reactive gas for supporting the stripping of the carbon layers which are to be stripped in gaseous form,
   initiating a plasma discharge in the vacuum chamber for forming a plasma of the reactive gas for supporting the necessary chemical reaction or reactions to produce a reactive stripping of the carbon layers in gaseous form from the substrate to be de-coated,
   conducting the reactive stripping in one or more steps, characterized in that
   the plasma discharge is produced as a low voltage direct current arc discharge, with discharge current between 20 A and 1000 A and with discharge voltage of at most 120 V, and during the at least one step of the reactive stripping:
   a gas containing nitrogen is used as the reactive gas, and the reactive gas used comprises predominantly nitrogen, and
   the substrate to be de-coated is connected as an anode for the low voltage direct current arc discharge, and thereby the surface of the substrate to be de-coated is bombarded essentially exclusively with electrons, so that at least a portion of the carbon layers is removed from the substrate to be de-coated without producing any sputtering of the carbon layers.

2. Process according to claim 1, characterized in that the substrate is brought into the low voltage direct current arc discharge in insulated state, so that the ions impinging on the substrate have energies essentially under 20 eV, and therefore below the sputter threshold.

3. Process according to claim 1, characterized in that for the low voltage direct current arc discharge, an electrode differing from the substrate holder and the chamber wall is used as the anode, and the substrate is maintained at floating potential.

4. Process according to claim 1, characterized in that to remove at least a portion of the carbon coating from the substrate during at least one step of the reactive de-coating, but not during the last step of the reactive de-coating, and during the first step of the reactive de-coating, a gas containing oxygen is used as the reactive gas, and the oxygen-containing reactive gas used comprises predominantly oxygen gas.

5. Process according to claim 4, characterized in that the flow of oxygen-containing reactive gas is terminated before the carbon layer is completely removed at any part of the substrate by the reaction with oxygen, so that it is prevented that any de-coated substrate surface begins to be oxidized by reaction with the oxygen.

6. Process according to claim 5, characterized in that after the flow of oxygen-containing reactive gas is terminated, hydrogen gas is introduced into the stripping chamber, so that the oxygen component in the coating and the undesirable residue of oxygen in the substrate surface are reduced.

7. Process according to claim 4, characterized in that the oxygen-containing reactive gas used comprises essentially entirely oxygen.

8. Application of a process according to claim 1 for the stripping of substrates coated with carbon layers, whereby the carbon layers contain in addition to carbon other non-metallic elements, particularly hydrogen (H), boron (B), silicon (Si) and/or germanium (Ge).

9. Process according to claim 1, characterized in that the discharge current ranges between 50 A and 300 A, and the discharge voltage ranges between 20 V and 80 V.

10. Process for reactive de-coating of carbon layers from a substrate, particularly for the reactive removal of ta-C coatings from the substrate surfaces of tools and components, in which the substrate to be de-coated is placed on a substrate holder in a vacuum chamber, the vacuum chamber is charged with at least one reactive gas supporting the stripping of carbon in gaseous form, and a plasma discharge is initiated in the vacuum chamber to support the necessary chemical reaction or reactions to strip the coated substrate, and the de-coating proceeds in one step or a number of steps, characterized in that the plasma discharge is produced as a low voltage direct current arc discharge, with discharge current between 20 A and 1000 A, with discharge voltage of at most 120 V, to remove at least a portion of the carbon coating from the substrate, during at least one step of the reactive stripping, a gas containing nitrogen is used as the reactive gas, and the reactive gas used comprises predominantly nitrogen, and the substrate surface, after the completion of the reactive stripping, is absent from an oxidation.

* * * * *